(12) United States Patent
Woo et al.

(10) Patent No.: US 10,235,934 B2
(45) Date of Patent: Mar. 19, 2019

(54) ORGANIC LIGHT EMITTING DISPLAY PANEL AND ORGANIC LIGHT EMITTING DISPLAY DEVICE INCLUDING THE SAME

(71) Applicant: LG DISPLAY CO., LTD., Seoul (KR)

(72) Inventors: Dong Kyun Woo, Paju-si (KR); Gi-Hong Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 144 days.

(21) Appl. No.: 14/539,873

(22) Filed: Nov. 12, 2014

(65) Prior Publication Data

US 2015/0138178 A1 May 21, 2015

(30) Foreign Application Priority Data

Nov. 21, 2013 (KR) .................. 10-2013-0142154

(51) Int. Cl.
*G09G 3/3233* (2016.01)
*G09G 3/20* (2006.01)
*H01L 27/32* (2006.01)

(52) U.S. Cl.
CPC ......... *G09G 3/3233* (2013.01); *G09G 3/2003* (2013.01); *G09G 2300/0426* (2013.01); *G09G 2300/0439* (2013.01); *G09G 2300/0465* (2013.01); *G09G 2300/0842* (2013.01); *G09G 2330/021* (2013.01); *H01L 27/3218* (2013.01)

(58) Field of Classification Search
CPC ......... G09G 2310/0235; G09G 3/3607; G09G 3/2003; G09G 3/3614; G02F 2201/52
USPC .................................... 345/96, 209
See application file for complete search history.

(56) References Cited

U.S. PATENT DOCUMENTS

| 7,205,713 | B2 * | 4/2007 | Kiguchi | H01L 27/3216 |
| | | | | 313/498 |
| 8,184,224 | B2 * | 5/2012 | Asano | G09G 3/3233 |
| | | | | 257/213 |
| 8,441,416 | B2 * | 5/2013 | Kang | G09G 3/32 |
| | | | | 345/76 |
| 2003/0151568 | A1 | 8/2003 | Ozawa | |

(Continued)

FOREIGN PATENT DOCUMENTS

| CN | 1231046 A | 10/1999 |
| CN | 101046565 A | 10/2007 |

(Continued)

*Primary Examiner* — Yuzhen Shen
(74) *Attorney, Agent, or Firm* — Birch, Stewart, Kolasch & Birch, LLP (57) ABSTRACT

Discussed are an organic light emitting display panel and an organic light emitting display device including the same, which allows a uniform current to flow in a plurality of driving power lines, thereby reducing consumption power. The organic light emitting display panel can include first to mth gate lines and first to nth data lines configured to define a plurality of pixel areas by intersections therebetween, a plurality of color pixels respectively provided in the plurality of pixel areas, and a plurality of driving power lines. Each of the plurality power lines is shared by two color pixels which are adjacent to each other in a first direction corresponding to a length direction of the first to mth gate lines. Two color pixels, which are adjacent to each other in a second direction corresponding to a length direction of the plurality of driving power lines, have different colors.

18 Claims, 9 Drawing Sheets

(56) References Cited

U.S. PATENT DOCUMENTS

| | | | | |
|---|---|---|---|---|
| 2003/0189410 A1* | 10/2003 | Yamazaki | ............ | G09G 3/3266 315/169.1 |
| 2005/0231455 A1* | 10/2005 | Moon | ................... | G09G 3/3648 345/89 |
| 2007/0075627 A1* | 4/2007 | Kimura | ............... | H01L 27/3213 313/503 |
| 2008/0029768 A1* | 2/2008 | Asano | .................. | G09G 3/3233 257/72 |
| 2008/0100760 A1* | 5/2008 | Lee | ................... | G02F 1/133514 349/37 |
| 2010/0188391 A1* | 7/2010 | Kim | ..................... | G09G 3/3233 345/212 |
| 2012/0001946 A1 | 1/2012 | Cho et al. | | |
| 2012/0026144 A1* | 2/2012 | Kang | ................... | G09G 3/3225 345/211 |
| 2012/0056913 A1* | 3/2012 | Akimoto | ............. | G09G 3/3233 345/690 |

FOREIGN PATENT DOCUMENTS

| | | |
|---|---|---|
| CN | 1941029 B | 3/2011 |
| CN | 102314841 A | 1/2012 |

\* cited by examiner

ORGANIC LIGHT EMITTING DISPLAY PANEL AND ORGANIC LIGHT EMITTING DISPLAY DEVICE INCLUDING THE SAME

CROSS-REFERENCE TO RELATED APPLICATIONS

This application claims the benefit of the Korean Patent Application No. 10-2013-0142154 filed on Nov. 21, 2013, which is hereby incorporated by reference as if fully set forth herein.

BACKGROUND OF THE INVENTION

Field of the Invention

The present invention relates to an organic light emitting display device, and more particularly, to an organic light emitting display panel and an organic light emitting display device including the same, which can minimize a current deviation for each driving power line.

Discussion of the Related Art

Recently, with the advancement of multimedia, the importance of flat panel display (FPD) devices is increasing. Therefore, various types of FPD devices such as liquid crystal display (LCD) devices, plasma display panel (PDP) devices, field emission display (FED) devices, and organic light emitting display devices are being used practically. In such FPD devices, the organic light emitting display devices have a fast response time of 1 ms or less and low power consumption, and have no limitation in a viewing angle because the organic light emitting display devices self-emit light. Accordingly, the organic light emitting display devices are attracting much attention as next generation FPD devices.

Figure 1:
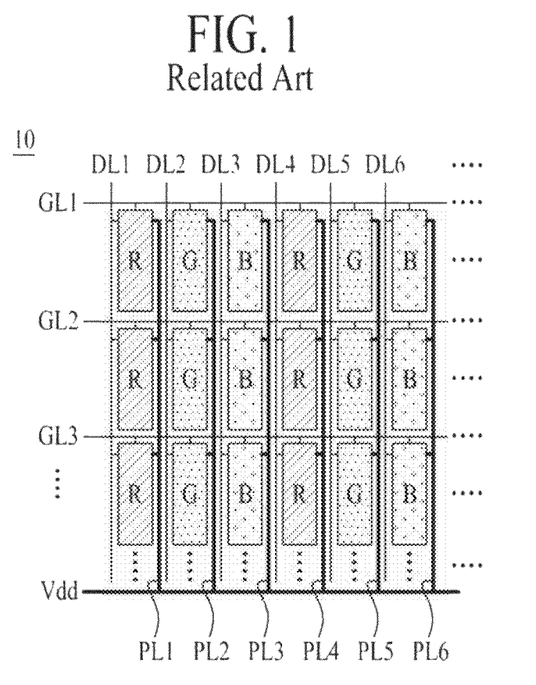
FIG. 1 is a diagram for describing a pixel arrangement structure of a general organic light emitting display panel.

A general organic light emitting display device, as illustrated in FIG. 1, includes a plurality of gate lines GL1-GL3, . . . and a plurality of data lines DL1-DL6, . . . which are formed to intersect each other and define a plurality of pixel areas, a plurality of color pixels R, G and B which are formed in each of the plurality of pixel areas, and a plurality of power lines PL1-PL6, . . . which are formed in parallel with the respective data lines DL1-DL6, . . . and are connected to the color pixels R, G and B adjacent thereto.

In the organic light emitting display panel, the plurality of color pixels R, G and B are repeatedly arranged in the order of a red pixel R, a green pixel G, and a blue pixel B for each horizontal line corresponding to a length direction of the gate lines GL1-GL3, . . . . In this case, color pixels having the same color which are disposed on each vertical line corresponding to a length direction of the data line DL are connected to one driving power line PL.

Figure 2:
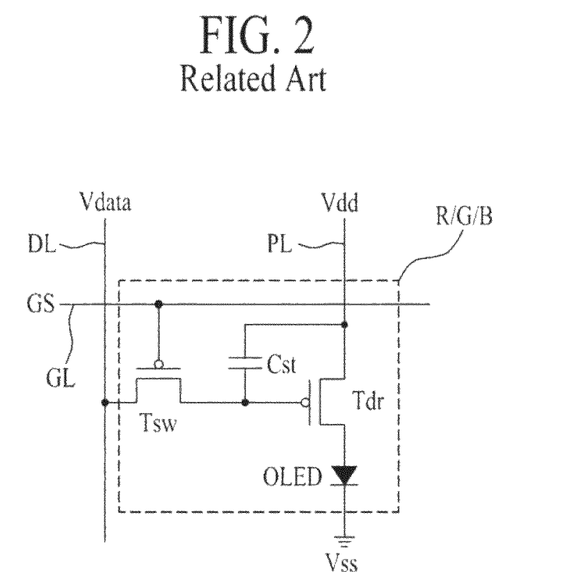
FIG. 2 is a circuit diagram for describing a structure of each color pixel of FIG. 1.

Each of the plurality of color pixels R, G and B, as illustrated in FIG. 2, includes a switching transistor Tsw, a driving transistor Tdr, a capacitor Cst, and an organic light emitting device OLED.

The switching transistor Tsw is turned on according to a gate signal GS supplied to an adjacent gate line GL, and supplies a data voltage Vdata, supplied through a data lines DL, to the driving transistor Tdr. The driving transistor Tdr is turned on with the data voltage Vdata supplied from the switching transistor Tsw, and controls a data current Ioled which flows from a driving voltage Vdd terminal, connected to a driving power line PL, to the organic light emitting device OLED. The capacitor Cst is connected between a gate terminal and a source terminal of the driving transistor Tdr, stores a voltage corresponding to the data voltage Vdata supplied to the gate terminal of the driving transistor Tdr, and turns on the driving transistor Tdr with the stored voltage. The organic light emitting device OLED is electrically connected between the source terminal of the driving transistor Tdr and a ground line VSS, and emits light with the data current Ioled supplied from the driving transistor Tdr.

Each of the color pixels R, G and B of the organic light emitting display panel 10 controls a level of the data current Ioled, which flows from the driving voltage Vdd terminal to the organic light emitting device OLED, by using a switching operation of the driving transistor Tdr based on the data voltage Vdata to emit the organic light emitting device OLED, thereby displaying an image.

Consumption power of the general organic light emitting display device is determined by a multiplication of a voltage V, applied from the driving power line PL to the driving transistor Tdr and the organic light emitting device OLED, and a current I which flows in the organic light emitting device OLED.

Figure 3:
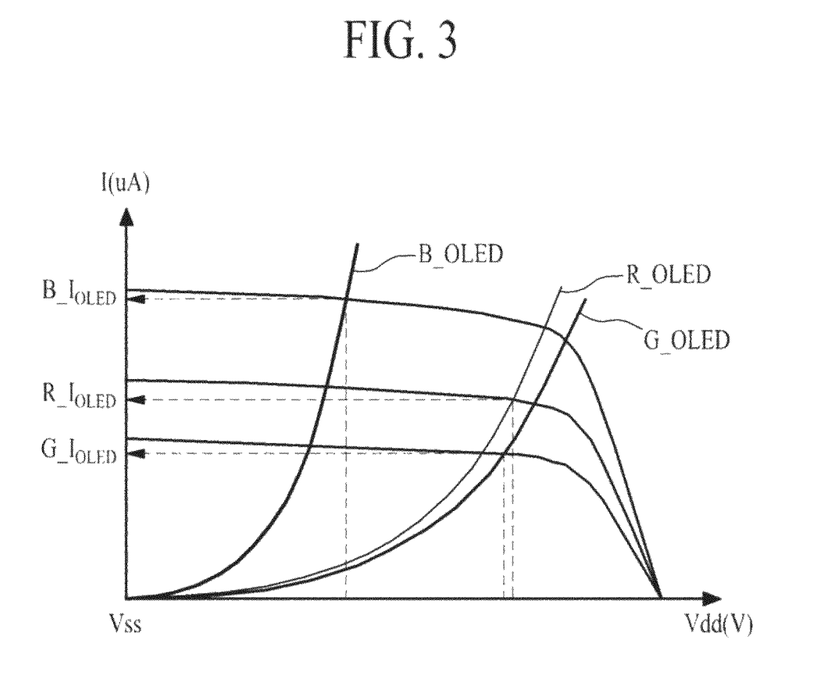
FIG. 3 is a graph showing a current characteristic of an organic light emitting device, included in each of a red color pixel, a green color pixel, and a blue color pixel illustrated in FIG. 1, with respect to a voltage.

In the general organic light emitting display device, as illustrated in FIG. 3, a plurality of organic light emitting devices R_OLED, G_OLED and B_OLED which are respectively included in the red pixel R, the green pixel G, and the blue pixel B have different current characteristics with respect to a voltage and different luminance characteristics with respect to the voltage, and thus, a driving current $R\_I_{OLED}$ of the red pixel R, a driving current $G\_I_{OLED}$ of the green pixel G, and a driving current $B\_I_{OLED}$ of the blue pixel B are changed according to a target luminance of the organic light emitting display panel 10. For this reason, a current deviation for each driving power line PL occurs.

Therefore, in the general organic light emitting display device, consumption power used by the display device increases due to a current deviation for each driving power line PL, and since a voltage of the driving voltage Vdd terminal supplied to the driving power line PL is determined to include a voltage drop (IR Drop) amount of the driving power line PL in which a highest amount of current flows, the voltage of the driving voltage Vdd terminal increases. For this reason, consumption power of the general organic light emitting display device increases.

SUMMARY OF THE INVENTION

Accordingly, the present invention is directed to provide an organic light emitting display panel and an organic light emitting display device including the same that substantially obviate one or more problems due to limitations and disadvantages of the related art.

An aspect of the present invention is directed to provide an organic light emitting display panel and an organic light emitting display device including the same, which allows a uniform current to flow in a plurality of driving power lines, thereby reducing consumption power.

In addition to the aforesaid objects of the present invention, other features and advantages of the present invention will be described below, but will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided in one example an organic light emitting display panel including: first to mth (where m is a natural number) gate lines and first to nth data lines (where n is a natural number) configured to define a plurality of pixel areas by intersections therebetween; a plurality of color pixels respectively provided in the plurality of pixel areas; and a plurality of driving power lines, wherein each of the plurality power lines is shared by two color pixels which are adjacent to each other in a first direction corresponding to a length direction of the first to mth gate lines, wherein two color pixels, which are adjacent to each other in a second direction corresponding to a length direction of the plurality of driving power lines, have different colors.

In another aspect of the present invention, there is provided an organic light emitting display device including: the organic light emitting display panel; a gate driver configured to drive the first to mth gate lines; a data driver configured to supply data voltages to the first to nth data lines, respectively; a driving power supply unit configured to supply a driving voltage to the plurality of driving power lines; and a timing controller configured to control the gate driver and the data driver, align input image data to correspond to a pixel arrangement structure of the organic light emitting display panel, and supply the aligned image data to the data driver.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms. It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, an organic light emitting display panel and an organic light emitting display device according to embodiments of the present invention will be described in detail with reference to the accompanying drawings.

Figure 4:
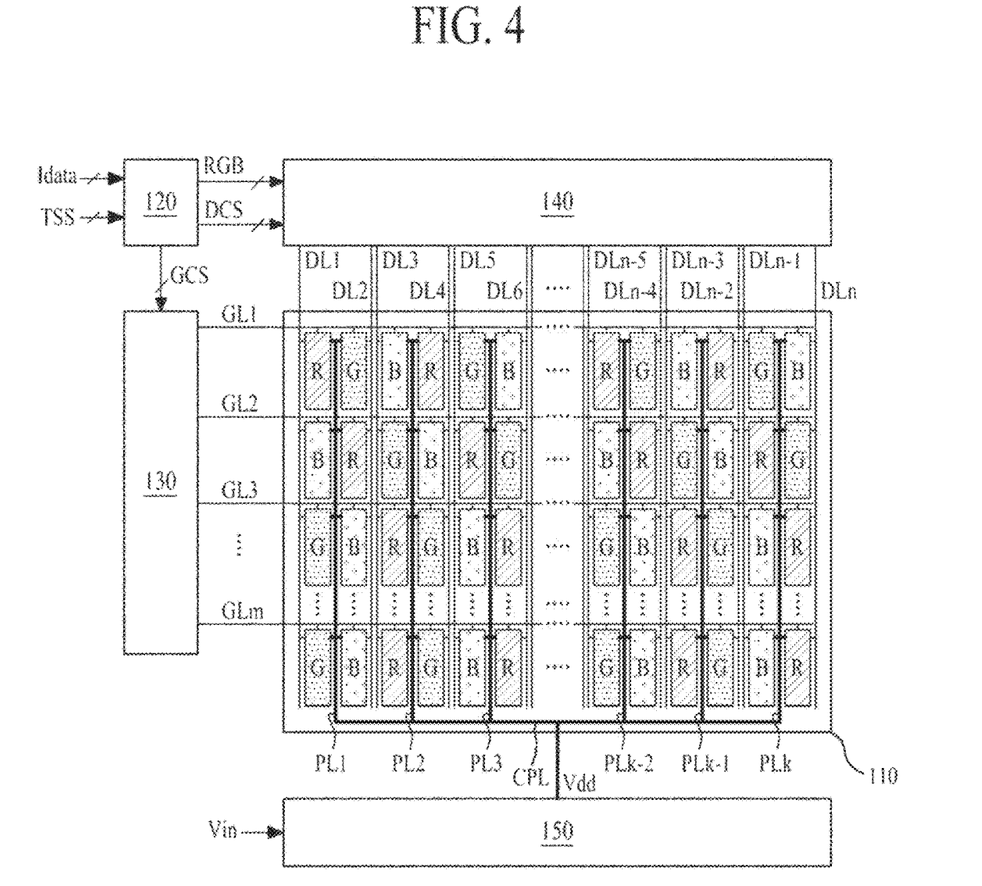
FIG. 4 is a diagram for describing an organic light emitting display panel and an organic light emitting display device including the same, according to a first embodiment of the present invention.
Figure 5:
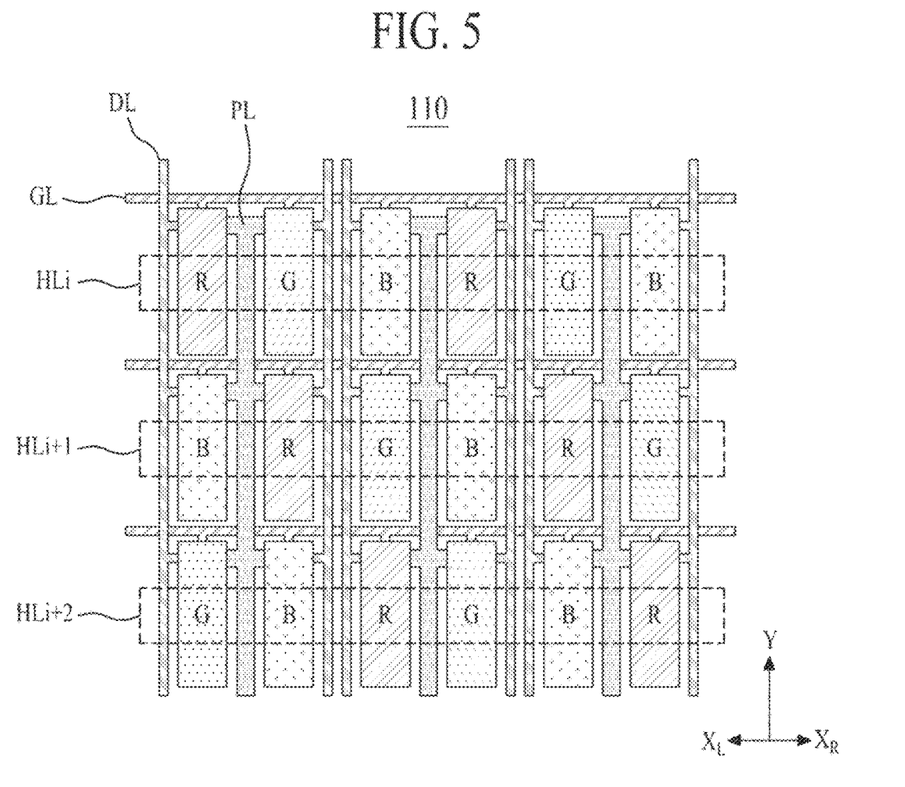
FIG. 5 is a diagram illustrating a pixel arrangement structure of the organic light emitting display panel of FIG. 4.

FIG. 4 is a diagram for describing an organic light emitting display panel and an organic light emitting display device including the same, according to a first embodiment of the present invention, and FIG. 5 is a diagram illustrating a pixel arrangement structure of the organic light emitting display panel of FIG. 4.

Referring to FIGS. 4 and 5, the organic light emitting display device according to the first embodiment of the present invention includes an organic light emitting display panel 100, a timing controller 120, a gate driver 130, a data driver 140, and a driving power supply unit 150.

The organic light emitting display panel 110 includes first to mth (where m is a natural number) gate lines GL1 to GLm, first to nth (where n is a natural number) data lines DL1 to DLn, a plurality of color pixels R, G and B, and a plurality of driving power lines PL1 to PLk.

The first to mth gate lines GL1 to GLm are arranged at certain intervals in parallel with a long side of the organic light emitting display panel 110.

The first to nth data lines DL1 to DLn are arranged at certain intervals to intersect the first to mth gate lines GL1 to GLm.

The plurality of driving power lines PL1 to PLk are respectively arranged between the first to nth data lines DL1 to DLn in parallel with the data line DL, and thus, each of the driving power lines PL1 to PLk is shared by two color pixels (R+G, B+R, G+B) which are adjacent to each other in a first direction ($X_R$, $X_L$) corresponding to a length direction of the gate line GL. Thus, two color pixels (R+G, B+R, G+B) which are adjacent to each other in a left and right direction share one driving power line PL. Therefore, according to the first embodiment of the present invention, the number of the driving power lines PL1 to PLk can be reduced by half in comparison with the pixel arrangement structure of FIG. 1, and thus, a line width of each of the driving power lines PL1 to PLk increases. Accordingly, a drop of a voltage can be reduced, or an aperture ratio of each of the color pixels R, G and B can increase.

An end of one side of each of the plurality of driving power lines PL1 to PLk is connected to a driving power common line CPL in common. A driving voltage Vdd having a constant voltage level is supplied from the driving power supply unit 150 to the driving power common line CPL.

Each of the plurality of color pixels R, G and B is disposed in a corresponding pixel area among a plurality of pixel areas defined by intersections between the first to mth gate lines GL1 to GLm and the first to nth data lines DL1 to DLn. One color pixel may be one selected from the red pixel R, the green pixel G, and the blue pixel B, and the red pixel R, the green pixel G, and the blue pixel B which are disposed adjacent to each other in the first direction ($X_R$, $X_L$) corresponding to the length direction of the gate line GL constitute a unit pixel that displays an image. Each of the plurality of color pixels R, G and B, as illustrated in FIG. 2, includes a switching transistor Tsw, a driving transistor Tdr, a capacitor Cst, and an organic light emitting device OLED, and thus, its detailed description is not repeated.

In each of a plurality of horizontal lines HLi, HLi+1 and HLi+2 corresponding to the first direction ($X_R$, $X_L$), two adjacent color pixels (R/G, B/R, G/B) shared by each of the plurality of driving power lines PL1 to PLk have different colors. Two color pixels which are adjacent to each other in a second direction Y corresponding to a length direction of the driving power lines PL1 to PLk have different colors. Here, the pixel area in which each of the plurality of color pixels R, G and B is disposed may have a longitudinal and rectangular shape having a long side parallel to the second direction Y.

In detail, color pixels R, G and B which are disposed along the first direction ($X_R$, $X_L$) are disposed to be shifted by one color pixel in a right ($X_R$) or left ($X_L$) direction and in the first direction ($X_R$, $X_L$), for each of the horizontal lines HLi, HLi+1 and HLi+2. For example, color pixels are repeatedly disposed on an ith horizontal line HLi in the order of red, green, and blue, and color pixels are disposed to be shifted by one color pixel in a right direction on an i+1st horizontal line HLi+1 with respect to the pixel arrangement structure of the ith horizontal line HLi. Also, color pixels are disposed to be shifted by one color pixel in a right ($X_R$) direction on an i+2nd horizontal line HLi+2 with respect to the pixel arrangement structure of the i+1st horizontal line HLi+1. Therefore, the same number of red pixel R, green pixel G, and blue pixel B are connected to each of the plurality of driving power lines PL1 to PLk. Thus, although the red pixel R, the green pixel G, and the blue pixel B have different current characteristics and different luminance characteristics with respect to a voltage, since the same number of red pixel R, green pixel G, and blue pixel B are connected to each of the plurality of driving power lines PL1 to PLk, a current deviation of the red pixel R, the green pixel G, and the blue pixel B is averaged, and thus, the same current flows in the plurality of driving power lines PL1 to PLk in realizing the same luminance, thereby reducing consumption power.

Figure 6:
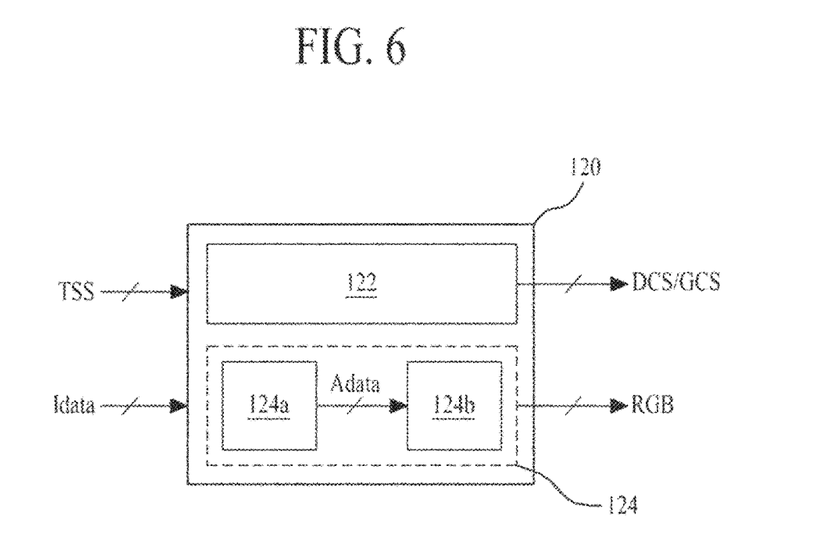
FIG. 6 is a block diagram for describing a configuration of a timing controller of FIG. 4.

The timing controller 120 controls driving of the gate driver 130 and the data driver 140, based on a timing sync signal TSS supplied from an external driving system (not shown) or a graphic card (not shown). Also, the timing controller 120 aligns input red, green, and blue image data Idata so as to be suitable for driving of the organic light emitting display panel 110, and supplies the aligned image data to the data driver 140. To this end, as illustrated in FIG. 6, the timing controller 120 includes a control signal generator 122 and a data processor 124.

The control signal generator 122 generates a gate control signal GCS used to control a driving timing of the gate driver 130 and a data control signal DCS used to control a driving timing of the data driver 140, based on the timing sync signal TSS including a vertical sync signal, a horizontal sync signal, a data enable signal, and a dot clock which are input thereto.

The data processor 124 according to an embodiment may include a first data aligner 124a and a second data aligner 124b.

The first data aligner 124a aligns the input red, green, and blue image data Idata so as to be suitable for a resolution of the organic light emitting display panel 110, thereby generating digital alignment data Adata in units of one horizontal period.

The second data aligner 124b realigns the digital alignment data Adata supplied from the first data aligner 124a so as to match a pixel arrangement structure of the organic light emitting display panel 110 at every one horizontal period, based on the horizontal sync signal, and supplies the realigned red, green, and blue pixel data RGB to the data driver 140.

The data processor 124 according to another embodiment aligns image data Idata input from the driving system so as to match a resolution of the organic light emitting display panel 110, and stores the image data in a frame memory (not shown) in units of a frame. Also, the data processor 124 realigns the image data Idata stored in the frame memory so as to match a pixel arrangement structure of each horizontal line of the organic light emitting display panel 110, and supplies the realigned red, green, and blue pixel data RGB to the data driver 140.

Referring again to FIGS. 4 and 5, the gate driver 130 generates a gate signal GS according to the gate control signal GCS supplied from the timing controller 120, and sequentially supplies the gate signal GS to the plurality of gate lines GL1 to GLm.

The data driver 140 converts the red, green, and blue pixel data RGB, supplied from the timing controller 120, into data voltages Vdata according to the data control signal DCS supplied from the timing controller 120, and respectively supplies the data voltages Vdata to the data lines DL1 to DLn in synchronization with the gate signal GCS. That is, the data driver 140 sequentially samples and latches sequentially-supplied pixel data RGB for one horizontal line in response to the data control signal DCS, and selects, as a data voltage, a grayscale voltage corresponding to each of the latched pixel data RGB from among a plurality of different grayscale voltages to supply the selected grayscale voltage to a corresponding data line DL.

The driving power supply unit 150 generates the driving voltage Vdd having a predetermined voltage level, based on an input voltage Vin supplied from the driving system, and supplies the generated driving voltage Vdd to the driving power common line CPL which is formed in the organic light emitting display panel 110.

In the organic light emitting display panel and the organic light emitting display device including the same according to the first embodiment of the present invention, each of the driving power lines PL1 to PLk is shared by two color pixels which are adjacent to each other in the first direction ($X_R$, $X_L$) corresponding to the length direction of the gate line GL, and the number of red pixels R shared by each driving power line is equal to the number of green pixels G and blue pixels B shared by each driving power line. Accordingly, a uniform current flows in the driving power lines PL1 to PLk, thereby reducing consumption power.

Figure 7:
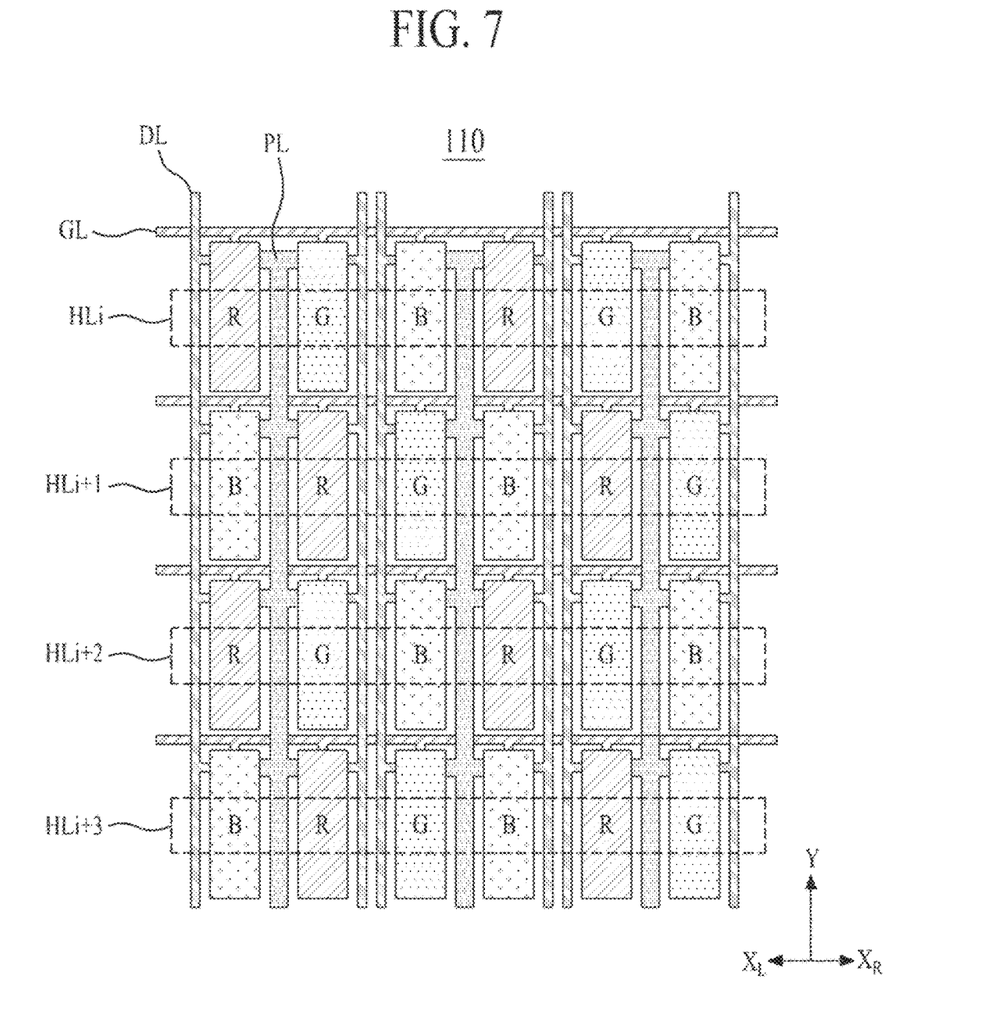
FIG. 7 is a diagram for describing an organic light emitting display panel and an organic light emitting display device including the same, according to a second embodiment of the present invention.

FIG. 7 is a diagram for describing an organic light emitting display panel and an organic light emitting display device including the same, according to a second embodiment of the present invention, and is implemented by changing a pixel arrangement structure of the organic light emitting display panel of FIG. 4. In the following description, descriptions repetitive of elements which are the same as or correspond to those of the preceding embodiment are not repeated, and only a pixel arrangement structure of the organic light emitting display panel will be described.

In each of a plurality of horizontal lines HLi, HLi+1, HLi+2 and HLi+3 corresponding to the first direction ($X_R$, $X_L$), two adjacent color pixels (R/G, B/R, G/B) shared by each of the plurality of driving power lines PL1 to PLk have different colors. Two color pixels which are adjacent to each other in the second direction Y corresponding to the length direction of the driving power lines PL1 to PLk have different colors.

In detail, a plurality of color pixels which are disposed on an i+1st (where i is a natural number between one and m−1) horizontal line HLi+1 corresponding to the first direction ($X_R$, $X_L$) may be disposed to be shifted by one color pixel in a right ($X_R$) or left ($X_L$) direction and in the first direction ($X_R$, $X_L$) with respect to a plurality of color pixels disposed on an ith horizontal line HLi. For example, a plurality of color pixels may be repeatedly disposed in the order of red, green, and blue on odd-numbered horizontal lines HLi and HLi+2, and a plurality of color pixels may be disposed to be shifted by one color pixel in a right ($X_R$) on even-numbered horizontal lines HLi+1 and HLi+3 with respect to the pixel arrangement structure of the odd-numbered horizontal line HLi and HLi+2.

Additionally, the timing controller 120 aligns input red, green, and blue image data Idata so as to match a pixel arrangement structure of an organic light emitting display panel 110 of FIG. 7, and supplies the aligned image data to the data driver 140. That is, the data processor 124 of the timing controller 120 (see FIG. 6) aligns input image data Idata so as to be suitable for a resolution of the organic light emitting display panel 110, realigns the aligned alignment data so as to match a pixel arrangement structure of each horizontal line, and supplies the realigned data to the data driver 140. In this case, the timing controller 120 shifts, by a width of one color pixel, alignment data for an i+1st horizontal line, and supplies the shifted data to the data driver 140. For example, in an odd-numbered horizontal period, the data processor 124 may realign alignment data of one horizontal line so as to be repeated in the order of red, green, and blue, and supply the realigned data to the data driver 140. Also, in an even-numbered horizontal period, the data processor 124 may realign alignment data of one horizontal line so as to be repeated in the order of blue, red, and green, and supply the realigned data to the data driver 140.

Figure 8:
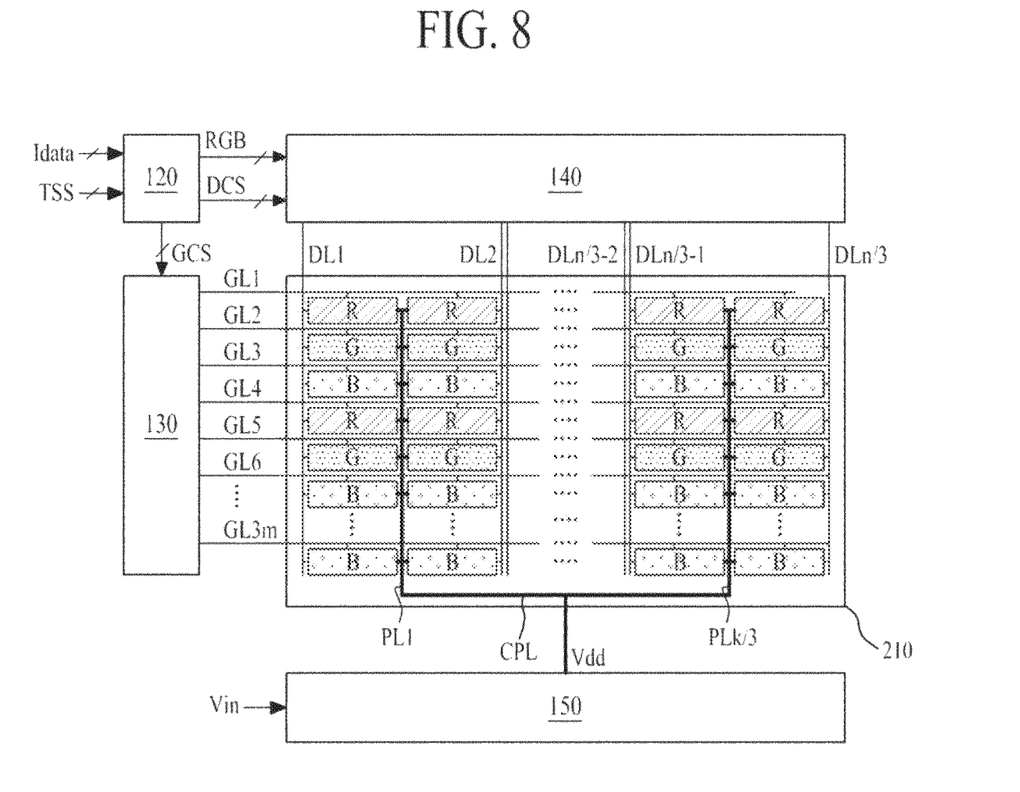
FIG. 8 is a diagram for describing an organic light emitting display panel and an organic light emitting display device including the same, according to a third embodiment of the present invention.
Figure 9:
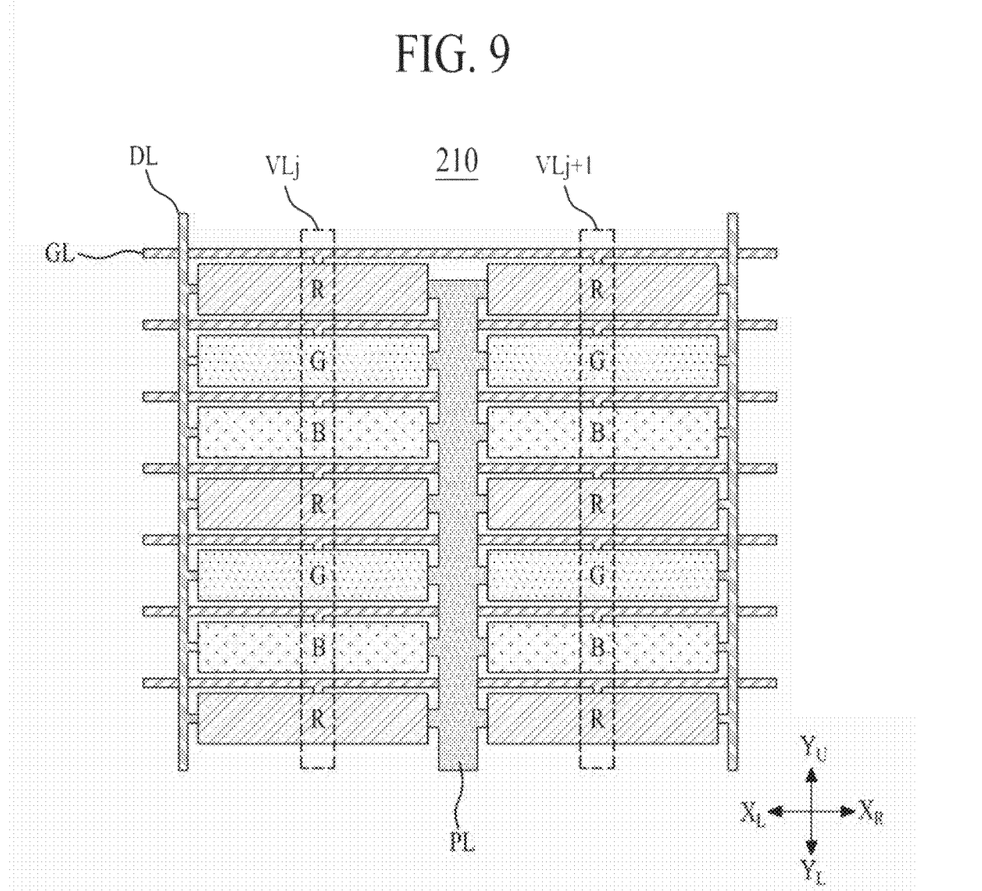
FIG. 9 is a diagram illustrating a pixel arrangement structure of the organic light emitting display panel of FIG. 8.

FIG. 8 is a diagram for describing an organic light emitting display panel and an organic light emitting display device including the same, according to a third embodiment of the present invention, and FIG. 9 is a diagram illustrating a pixel arrangement structure of the organic light emitting display panel of FIG. 8. This is implemented by changing a pixel arrangement structure of an organic light emitting display panel 210. In the following description, descriptions repetitive of elements which are the same as or correspond to those of the preceding embodiment are not repeated, and only the pixel arrangement structure of the organic light emitting display panel 210 will be described.

First, a pixel area in which each of a plurality of pixel areas R, G and B is formed may have a horizontal and rectangular shape having a long side parallel to the first direction ($X_R$, $X_L$) corresponding to the length direction of the gate lines GL1 to GLm. Therefore, according to the second embodiment of the present invention, in comparison with the pixel arrangement structure of FIG. 1, the number of data lines DL1 to DLn/3 is reduced by 1/6, and the number of driving power lines PL1 to PLk/3 is also reduced by 1/6, whereby a line width of each of the driving power lines PL1 to PLk/3 increases. Accordingly, a drop of a voltage can be reduced, or an aperture ratio of each of the color pixels R, G and B can increase.

A plurality of color pixels which are disposed in the first direction ($X_R$, $X_L$) have the same color. Two color pixels which are adjacent to each other in a second direction ($Y_U$, $Y_L$) corresponding to a length direction of the driving power lines PL1 to PLk/3 has different colors. For example, a plurality of color pixels which are disposed on each of a plurality of vertical lines VLj and VLj+1 corresponding to the second direction ($Y_U$, $Y_L$) may be repeatedly disposed in the order of red, green, and blue. Therefore, the same number of red pixel R, green pixel G, and blue pixel B are connected to each of the plurality of driving power lines PL1 to PLk/3, and a current deviation of the red pixel R, the green pixel G, and the blue pixel B is averaged. Accordingly, the same current flows in the plurality of driving power lines PL1 to PLk/3 in realizing the same luminance, thereby reducing consumption power.

Additionally, the timing controller 120 aligns input red, green, and blue image data Idata so as to match a pixel arrangement structure of an organic light emitting display panel 210 of FIG. 8, and supplies the aligned image data to the data driver 140. That is, the data processor 124 of the timing controller 120 (see FIG. 6) aligns input image data Idata so as to be suitable for a resolution of the organic light emitting display panel 210, realigns the aligned alignment data in the order of red, green, and blue alignment data at every horizontal period, and supplies the realigned data to the data driver 140. For example, in a 3i−2nd horizontal period, the data processor 124 may realign only red alignment data of each unit pixel among alignment data of three horizontal line units, and supply the realigned data to the data driver 140. Also, in a 3i−1st horizontal period, the data processor 124 may realign only green alignment data of each unit pixel among alignment data of three horizontal line units, and supply the realigned data to the data driver 140. Also, in a 3ith horizontal period, the data processor 124 may realign only blue alignment data of each unit pixel among alignment data of three horizontal line units, and supply the realigned data to the data driver 140.

According to the organic light emitting display panel and the organic light emitting display device including the same according to the third embodiment of the present invention, the number of red pixels R shared by each of the driving power lines PL1 to PLk/3 is equal to the number of green pixels G and blue pixels B shared by each of the driving power lines PL1 to PLk/3. Accordingly, a uniform current flows in the driving power lines PL1 to PLk/3, thereby reducing consumption power.

Figure 10:
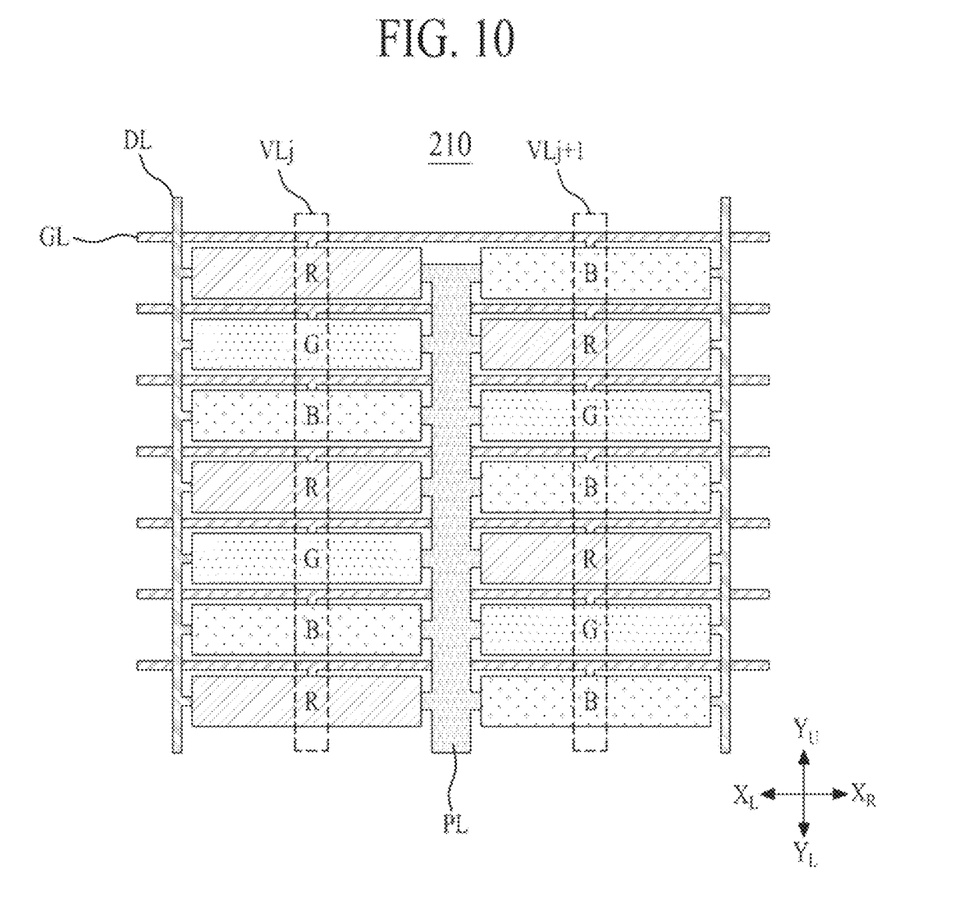
FIG. 10 is a diagram for describing an organic light emitting display panel and an organic light emitting display device including the same, according to a fourth embodiment of the present invention.

FIG. 10 is a diagram for describing an organic light emitting display panel and an organic light emitting display device including the same, according to a fourth embodiment of the present invention, and is implemented by changing a pixel arrangement structure of the organic light emitting display panel of FIG. 8. In the following description, descriptions repetitive of elements which are the same as or correspond to those of the preceding embodiment are not repeated, and only a pixel arrangement structure of the organic light emitting display panel will be described.

Two color pixels which are adjacent to each other in the first direction ($X_R$, $X_L$) have different color. Two color pixels which are adjacent to each other in the second direction ($Y_U$, $Y_L$) corresponding to the length direction of the driving power lines PL1 to PLk/3 have different colors.

In detail, a plurality of color pixels which are disposed on a j+1st (where j is a natural number between one and n/3−1) vertical line VLj+1 corresponding to the second direction ($Y_U$, $Y_L$) may be disposed to be shifted by one color pixel in a down ($Y_L$) direction and in the second direction ($Y_U$, $Y_L$) with respect to a plurality of color pixels disposed on a jth vertical line VLi. For example, a plurality of color pixels may be repeatedly disposed in the order of the red pixel R and the blue pixel B on a 3i−2nd horizontal line, a plurality of color pixels may be repeatedly disposed in the order of the green pixel G and the red pixel R on a 3i−1st horizontal line, and a plurality of color pixels may be repeatedly disposed in the order of the blue pixel B and the green pixel G on a 3ith horizontal line.

Additionally, the timing controller 120 aligns input red, green, and blue image data Idata so as to match a pixel arrangement structure of an organic light emitting display panel 210 of FIG. 10, and supplies the aligned image data to the data driver 140. That is, in a 3i−2nd horizontal period, the data processor 124 of the timing controller 120 (see FIG. 6) may realign only red and blue alignment data of each unit pixel among alignment data of three horizontal line units so as to be repeated in the order of red and blue, and supply the realigned data to the data driver 140. Also, in a 3i−1st horizontal period, the data processor 124 may realign only green and red alignment data of each unit pixel among alignment data of three horizontal line units so as to be repeated in the order of green and red, and supply the realigned data to the data driver 140. Also, in a 3ith horizontal period, the data processor 124 may realign only blue and green alignment data of each unit pixel among alignment data of three horizontal line units so as to be repeated in the order of blue and green, and supply the realigned data to the data driver 140.

Figure 11:
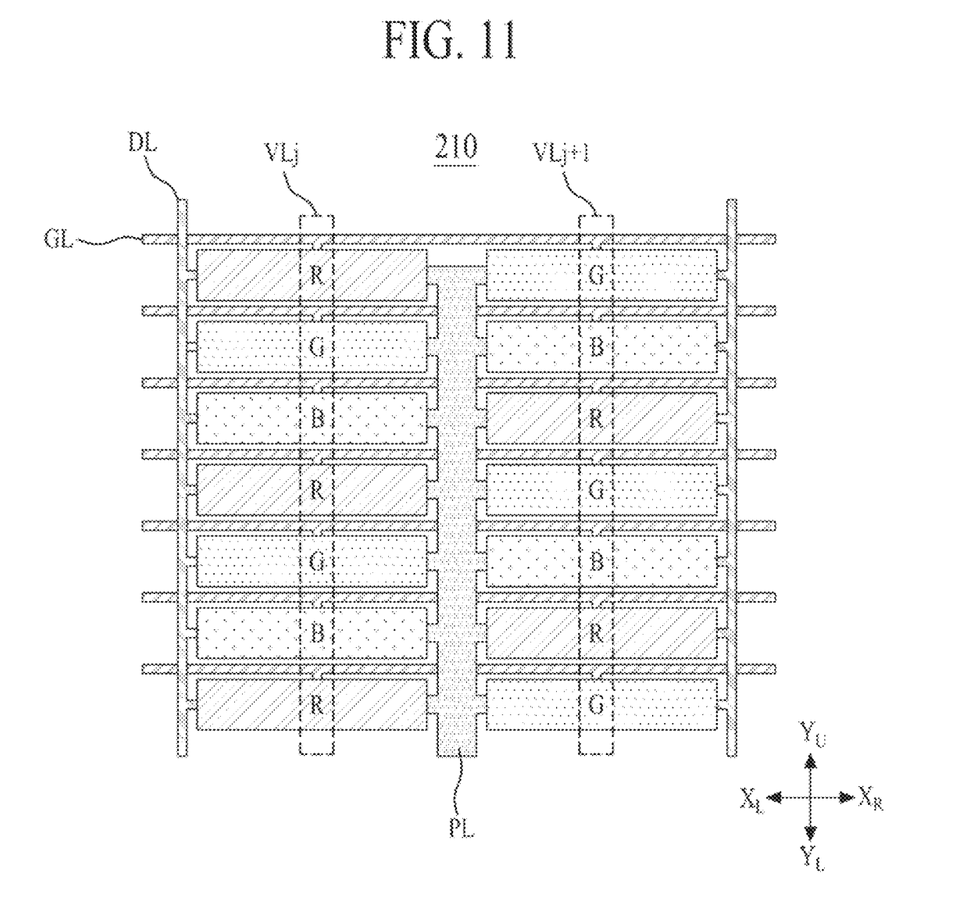
FIG. 11 is a diagram for describing an organic light emitting display panel and an organic light emitting display device including the same, according to a fifth embodiment of the present invention.

FIG. 11 is a diagram for describing an organic light emitting display panel and an organic light emitting display device including the same, according to a fifth embodiment of the present invention, and is implemented by changing a pixel arrangement structure of the organic light emitting display panel of FIG. 8. In the following description, descriptions repetitive of elements which are the same as or correspond to those of the preceding embodiment are not repeated, and only a pixel arrangement structure of the organic light emitting display panel will be described.

A plurality of color pixels which are disposed in the first direction ($X_R$, $X_L$) have the same color. Two color pixels which are adjacent to each other in the second direction ($Y_U$, $Y_L$) corresponding to the length direction of the driving power lines PL1 to PLk/3 have different colors.

In detail, a plurality of color pixels which are disposed on a j+1st (where j is a natural number between one and n/3−1) vertical line VLj+1 corresponding to the second direction ($Y_U$, $Y_L$) may be disposed to be shifted by one color pixel in an up ($Y_U$) direction and in the second direction ($Y_U$, $Y_L$) with respect to a plurality of color pixels disposed on a jth vertical line VLi. For example, a plurality of color pixels may be repeatedly disposed in the order of the red pixel R and the green pixel G on a 3i−2nd horizontal line, a plurality of color pixels may be repeatedly disposed in the order of the green pixel G and the blue pixel B on a 3i−1st horizontal line, and a plurality of color pixels may be repeatedly disposed in the order of the blue pixel B and the red pixel R on a 3ith horizontal line.

Additionally, the timing controller 120 aligns input red, green, and blue image data Idata so as to match a pixel arrangement structure of an organic light emitting display panel 210 of FIG. 11, and supplies the aligned image data to the data driver 140. That is, in a 3i−2nd horizontal period, the data processor 124 of the timing controller 120 (see FIG. 6) may realign only red and green alignment data of each unit pixel among alignment data of three horizontal line units so as to be repeated in the order of red and green, and supply the realigned data to the data driver 140. Also, in a 3i−1st horizontal period, the data processor 124 may realign only green and blue alignment data of each unit pixel among alignment data of three horizontal line units so as to be repeated in the order of green and blue, and supply the realigned data to the data driver 140. Also, in a 3ith horizontal period, the data processor 124 may realign only blue and red alignment data of each unit pixel among alignment data of three horizontal line units so as to be repeated in the order of blue and red, and supply the realigned data to the data driver 140.

In the organic light emitting display panel and the organic light emitting display device including the same according to the embodiments of the present invention, as listed in the following Table 1, it can be seen that a voltage drop (IR Drop) of each of a plurality of driving power lines PL1 to PL3 is reduced.

TABLE 1

| | Comparative Example | | | Example 1 | Example 2 | | | Example 3 | Example 4 | Example 5 |
|---|---|---|---|---|---|---|---|---|---|---|
| Driving Power Line | PL1 | PL2 | PL3 | PL1~3 | PL1 | PL2 | PL3 | PL1~3 | PL1~3 | PL1~3 |
| Total Current(uA) | 2.166 | 3.109 | 2.760 | 2.678 | 2.637 | 2.934 | 2.463 | 8.034 | 8.034 | 8.034 |
| Number of Driving | | 960 | | 960 | | 960 | | 320 | 320 | 320 |

TABLE 1-continued

| Driving Power Line | Comparative Example | | | Example 1 | Example 2 | | | Example 3 | Example 4 | Example 5 |
|---|---|---|---|---|---|---|---|---|---|---|
| | PL1 | PL2 | PL3 | PL1~3 | PL1 | PL2 | PL3 | PL1~3 | PL1~3 | PL1~3 |
| Power Lines | | | | | | | | | | |
| Vdd IR Drop(V) | 1.616 | 2.319 | 2.058 | 1.998 | 1.967 | 2.189 | 1.837 | 1.998 | 1.998 | 1.998 |
| IR Drop Deviation (V) | | Ref | | 0.321 | | 0.130 | | 0.321 | 0.321 | 0.321 |
| IR Drop Improvement Rate(%) | | Ref | | 13.85 | | 5.61 | | 13.85 | 13.85 | 13.85 |

Table 1 shows that a total of current (uA) flowing in first to third driving power lines and a drop (IR Drop) of the driving voltage Vdd are measured in the Comparative Example and the organic light emitting display panel according to the first to fifth (Examples 1-5) embodiments of the present invention, and a voltage drop deviation and an improvement rate of the first to fifth embodiments of the present invention are measured in comparison with the Comparative Example. In Table 1, red, green, and blue organic light emitting devices having a characteristic of a current with respect to the driving voltage of FIG. 3 are applied to the Comparative Example and the Examples 1 to 5. That is, in Table 1, the Comparative Example is based on the related art's FIG. 3, whereas the Examples 1-5 are based on the first to fifth embodiments of the present invention.

In Table 1, an organic light emitting display panel of the Comparative Example has a pixel arrangement structure in which two color pixels which are adjacent to each other in a length direction of a gate line are shared by one driving power line, and a plurality of color pixels are repeatedly disposed in the order of red, green, and blue on each horizontal line.

It can be seen that a drop of a voltage and a total current (uA) flowing in first to third driving power lines PL1 to PL3 of each of the Examples 1 to 5 are reduced with respect to the second driving power line PL2 having a largest drop amount of a voltage of the Comparative Example. Therefore, in comparison with the Comparative Example, it can be seen that a voltage drop deviation of each of the Examples 1 to 5 is reduced, and thus, an improvement rate for a drop of a voltage is enhanced by the present invention.

According to the embodiments of the present invention, two color pixels which are adjacent to each other in a first direction corresponding to a length direction of a gate line share one driving power line, and two color pixels which are adjacent to each other in a second direction corresponding to a length direction of a driving power line are disposed to have different colors. Therefore, a uniform current flows in a plurality of driving power lines, and thus, a voltage drop deviation of the plurality of driving power lines is uniformized or minimized, thereby reducing consumption power of an organic light emitting display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device comprising:
an organic light emitting display panel comprising:
first to mth gate lines and first to nth data lines configured to intersect to define a plurality of pixel areas, where m and n are natural numbers;
a plurality of color pixels respectively provided in the plurality of pixel areas, the plurality of color pixels comprising first color pixels, second color pixels, and third color pixels;
a driving power supply unit; and
a plurality of driving power lines,
wherein the driving power supply unit provides a driving voltage to each of the plurality of color pixels via a driving power common line and each of the plurality of driving power lines,
wherein the driving power supply unit is connected to a center portion of the driving power common line,
wherein each of the plurality of driving power lines is shared by two color pixels which are adjacent to each other in a first direction corresponding to a length direction of the first to mth gate lines,
wherein the two color pixels, which are adjacent to each other in the first direction, have different colors, and two color pixels, which are adjacent to each other in a second direction corresponding to a length direction of the plurality of driving power lines, have different colors,
wherein numbers of the first color pixels, the second color pixels, and the third color pixels connected to each of the plurality driving power lines are the same, and
wherein a line width of each of the plurality of driving power lines is increased as a number of the plurality of driving power lines is reduced, thereby reducing a drop of a voltage in the plurality of driving power lines;
a gate driver configured to drive the first to mth gate lines;
a data driver configured to supply data voltages to the first to nth data lines, respectively; and
a timing controller configured to control the gate driver and the data driver, align input image data to correspond to a pixel arrangement structure of the organic light emitting display panel, and supply the aligned image data to the data driver,
wherein the timing controller includes a data processor configured to align image data input from a driving system so as to match a resolution of the organic light emitting display panel and store the image data in a frame memory in units of a frame, and the data processor realigns the image data stored in the frame memory so as to match a pixel arrangement structure of each horizontal line of the organic light emitting display panel.

2. The organic light emitting display device of claim 1, wherein three color pixels adjacent to each other in the second direction include red, green, and blue pixels.

3. The organic light emitting display device of claim 2, wherein a plurality of color pixels in the first direction are shifted by one color pixel in the length direction of the first to mth gate lines on each horizontal line corresponding to the first direction.

4. The organic light emitting display device of claim 2, wherein a plurality of color pixels on an i+1 st horizontal line corresponding to the first direction are shifted by one color pixel in the first direction with respect to a plurality of color pixels on an ith horizontal line, where i is a natural number between one and m−1.

5. The organic light emitting display device of claim 2, wherein a plurality of color pixels on a j+1st vertical line corresponding to the second direction are shifted by one color pixel in the second direction with respect to a plurality of color pixels on a jth vertical line, where j is a natural number between one and n−1.

6. The organic light emitting display device of claim 1, wherein a plurality of color pixels in the first direction are shifted by one color pixel in the length direction of the first to mth gate lines on each horizontal line corresponding to the first direction.

7. The organic light emitting display device of claim 1, wherein a plurality of color pixels on an i+1st horizontal line corresponding to the first direction are shifted by one color pixel in the first direction with respect to a plurality of color pixels on an ith horizontal line, where i is a natural number between one and m−1.

8. The organic light emitting display device of claim 1, wherein a plurality of color pixels on a j+1st vertical line corresponding to the second direction are shifted by one color pixel in the second direction with respect to a plurality of color pixels on a jth vertical line, where j is a natural number between one and n−1.

9. An organic light emitting display device comprising:
gate lines and data lines configured to intersect each other to define a plurality of pixel areas;
a plurality of color pixels respectively provided in the plurality of pixel areas, the plurality of color pixels comprising first color pixels, second color pixels, and third color pixels;
a driving power supply unit;
a timing controller configured to control a gate driver and a data driver, align input image data to correspond to a pixel arrangement structure of the organic light emitting display device and supply the aligned image data to the data driver; and
a plurality of driving power lines, each of the driving power lines being shared by two color pixels which are adjacent to each other in a first direction corresponding to a length direction of the gate lines,
wherein the driving power supply unit provides a driving voltage to each of the plurality of color pixels via a driving power common line and each of the plurality of driving power lines,
wherein the driving power supply unit is connected to a center portion of the driving power common line,
wherein the two color pixels, which are adjacent to each other in the first direction, have different colors,
wherein numbers of the first color pixels, the second color pixels, and the third color pixels connected to each of the plurality driving power lines are the same,
wherein a line width of each of the plurality of driving power lines is increased as a number of the plurality of driving power lines is reduced, thereby reducing a drop of a voltage in the plurality of driving power lines, and
wherein the timing controller includes a data processor configured to align image data input from a driving system so as to match a resolution of the organic light emitting display device and store the image data in a frame memory in units of a frame, and the data processor realigns the image data stored in the frame memory so as to match a pixel arrangement structure of each horizontal line of the organic light emitting display device.

10. The organic light emitting display device of claim 9, wherein two color pixels adjacent to each other in the second direction have different colors.

11. The organic light emitting display device of claim 9, wherein three color pixels adjacent to each other in the second direction include red, green, and blue pixels.

12. An organic light emitting display device comprising:
a plurality of gate lines in a first direction;
a plurality of data lines in a second direction;
a plurality of pixel areas defined by intersections of the plurality of gate lines and the plurality of data lines;
a plurality of driving power lines in parallel with the respective plurality of data lines;
a plurality of color pixels including a first color pixel, a second color pixel and a third color pixel in each of the plurality of pixel areas; and
a timing controller configured to control a gate driver and a data driver, align input image data to correspond to a pixel arrangement structure of the organic light emitting display device and supply the aligned image data to the data driver,
wherein two color pixels adjacent to each other in the first direction corresponding to a length direction of the plurality of gate lines share one power line and two color pixels adjacent to each other in the second direction corresponding to a length direction of the plurality of power lines have different colors,
wherein same numbers of first color pixels, second color pixels and third color pixels are connected to each of the plurality driving power lines so that a uniform current flows in each of the plurality of driving power lines, thereby minimizing a voltage drop deviation of the plurality of driving power lines and reducing consumption power of the organic light emitting display device, and
wherein the timing controller includes a data processor configured to align image data input from a driving system so as to match a resolution of the organic light emitting display device and store the image data in a frame memory in units of a frame, and the data processor realigns the image data stored in the frame memory so as to match a pixel arrangement structure of each horizontal line of the organic light emitting display device.

13. The organic light emitting display device of claim 12, wherein the plurality of color pixels on an ith horizontal line are arranged repeatedly in an order of a red color pixel, a green color pixel and a blue color pixel, and the plurality of color pixels on an i+1st horizontal line are arranged to be shifted by one color pixel in a right direction with respect to a pixel arrangement structure of the ith horizontal line, where i is a natural number.

14. The organic light emitting display device of claim 12, wherein the plurality of color pixels on odd-numbered horizontal lines are arranged repeatedly in an order of a red color pixel, a green color pixel and a blue color pixel, and the plurality of color pixels on even-numbered horizontal lines are arranged repeatedly in an order of a blue color pixel, a red color pixel and a green color pixel.

15. The organic light emitting display device of claim 12, wherein an end of one side of each of the plurality of driving power lines is connected to a driving power common line and a driving voltage having a constant voltage level is supplied from a driving power supply unit to the driving power common line.

16. The organic light emitting display device of claim 12, wherein the plurality of color pixels have a horizontal and rectangular shape having a long side parallel to the first direction corresponding to the length direction of the plurality of gate lines.

17. The organic light emitting display device of claim 16, wherein the plurality of color pixels on a 3i-2nd horizontal line are in an order of a red color pixel and a blue color pixel, the plurality of color pixels on a 3i-1st horizontal line are in an order of a green color pixel and a red color pixel, and the plurality of color pixels on a 3ith horizontal line are in an order of a blue color pixel and a green color pixel, where i is a natural number.

18. The organic light emitting display device of claim 16, wherein a number of the plurality of data lines and a number of the plurality of driving power lines are reduced, so that a line width of each of the plurality of driving power lines is increased.

* * * * *